(12) United States Patent
Ro et al.

(10) Patent No.: US 6,608,380 B2
(45) Date of Patent: Aug. 19, 2003

(54) SEMICONDUCTOR CHIP PACKAGE HAVING ONE OR MORE SEALING SCREWS

(75) Inventors: Young-Hoon Ro, Chungcheongnam-do (KR); Jung-Hwan Chun, Chungcheongnam-do (KR); Heung-Kyu Kwon, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/975,470

(22) Filed: Oct. 9, 2001

(65) Prior Publication Data

US 2002/0041018 A1 Apr. 11, 2002

(30) Foreign Application Priority Data

Oct. 9, 2000 (KR) ......................................... 2000-59189

(51) Int. Cl.[7] ............................................... H01L 23/34
(52) U.S. Cl. ........................ 257/712; 257/678; 257/720
(58) Field of Search ................................. 257/678, 712, 257/720; 438/106, 121

(56) References Cited

U.S. PATENT DOCUMENTS 4,897,508 A * 1/1990 Mahulikar et al. ......... 174/52.4
5,504,372 A * 4/1996 Braden et al. ............... 257/723
6,294,408 B1 * 9/2001 Edwards et al. ............. 438/121

* cited by examiner

Primary Examiner—Nathan J. Flynn
Assistant Examiner—Leonardo Andújar
(74) Attorney, Agent, or Firm—Marger Johnson & McCollom, P.C.

(57) ABSTRACT

A semiconductor chip package comprising a chip with a lid having venting holes hermetically sealed with screws and a manufacturing method thereof are provided. The semiconductor chip package of the present invention comprises a chip such as a central processing unit (CPU) chip generating a large amount of heat; a substrate having upper and lower surfaces, the chip attached to the upper surface of the substrate; external connection terminals extending from the lower surface of the substrate and electrically connected to the chip; a lid attached to the upper surface of the substrate. The lid has a cavity for receiving the chip on a lower surface and venting holes penetrating the lid. The package includes sealing screws for hermetically sealing the venting holes. With the present invention, the venting holes formed through the lid are hermetically sealed without creating any voids or cracks in the sealant as in the prior art.

15 Claims, 7 Drawing Sheets

SEMICONDUCTOR CHIP PACKAGE HAVING ONE OR MORE SEALING SCREWS

RELATED APPLICATION

This application relies for priority upon Korean Patent Application No. 2000-59189, filed on Oct. 9, 2000, the contents of which are herein incorporated by reference in their entirety

BACKGROUND OF THE INVENTION

1. Field of the Invention

The present invention relates to the field of semiconductor devices and, more particularly, to a semiconductor chip package and a method for manufacturing the same.

2. Description of the Related Art

Usually, wire bonding is used for making electrical connections between central processing unit (CPU) chips and semiconductor packages. Recently, in order to meet a pressing demand for increased speed, a flip-chip bonding method has been employed. The structure of semiconductor packages using the flip-chip bonding method can be divided into two types, i.e. a lid type and a non-lid type. The lid type is applied in a semiconductor chip package comprising a high-frequency CPU chip with high heating value, and the non-lid type is applied in a semiconductor chip package comprising a low-frequency CPU chip with low heating value.

FIG. 1 and FIG. 2 show a conventional semiconductor chip package 100 having a lid 40. A CPU chip 20 is attached to the upper surface of a ceramic substrate 10 using the flip-chip bonding method and covered with a lid 40. Pluralities of external connection pins 60, which are electrically connected to the CPU chip 20, extend from a lower surface of the ceramic substrate 10. A flip chip bonding part between the CPU chip 20 and the ceramic substrate 10 is filled with an epoxy resin using an under-filling method. Notches 44 are formed through the lid 40 and spaced at a predetermined distance. A screw 42 is close fit on each notch 44 and combines with a heat sink (not shown) for the package 100.

The lid 40 is made of a material having a good heat emissive capacity such as Al or Cu, and comprises a cavity 48 for receiving the CPU chip 20 and the capacitors 30 on its lower surface. In order to maximize the heat emissive capacity through the lid 40, a thermal interface material 56 is interposed between a bottom surface of the cavity 48 of the lid 40 and an upper surface of the CPU chip 20. Thermosetting silicon adhesive is used as a sealant 54 for attaching the lid 40 to the upper surface of the ceramic substrate 10. After applying the sealant 54 to the perimeter of the ceramic substrate 10, the lid 40 is attached and the sealant 54 is hardened.

Thus, the cavity 48 is hermetically sealed. If the sealant 54 is hardened at a high temperature, the gas emitted by hardening the sealant 54 and air within the cavity 48 are expanded and then leaked through the sealant 54, thereby causing voids or cracks in the sealant 54.

Such a package is detected as a failure in the reliability test, i.e. Pressure Cooker Test (PCT). Voids or cracks in the sealant 54 are routes for penetrating the cavity 48 in the lid 40 with moisture. Herein, PCT is a moisture-resistant test carried out in a pressure cooker of 29.4 psi pressure, 100% humidity, and 121±2° C. temperature.

FIG. 3 shows another conventional semiconductor chip package 200 having a lid 140 with a venting hole 146. Referring to FIG. 3, the foregoing problem is prevented by forming the venting hole 146 on the lid 140. However, this package 200 also has some drawbacks in that the venting hole 146 should also be hermetically sealed. Further, if a thermosetting sealant 158 is used, which is the same material as the sealant 154, voids also occur in the sealant 158.

If a sealant which can be hardened at room temperature is used, failures due to air expansion, i.e. voids or cracks are prevented; the drawback being that the hardening time of this sealant, approximately 24 hours, is much longer than that of the other thermosetting sealant, about 1 hour, thereby decreasing productivity.

SUMMARY OF THE INVENTION

Accordingly, an object of the present invention is to hermetically seal the venting holes formed through the lid without creating any voids or cracks in the sealant.

The present invention contemplates, in general, a semiconductor chip package comprising a chip with a lid having venting holes hermetically sealed with screws and a manufacturing method thereof. The semiconductor chip package of the present invention comprises a chip; a substrate having upper and lower surfaces, the chip being attached to the upper surface of the substrate; external connection terminals extending from the lower surface of the substrate and electrically connected to the chip; a lid attached to the upper surface of the substrate. The lid includes a cavity for receiving the chip on a lower surface and also venting holes penetrating the lid. The package further includes sealing screws for hermetically sealing the venting holes.

At least one heat sink-attaching screw for being coupled to a heat sink is attached to an upper surface of the lid.

At least one hole for attaching the heat sink-attaching screw is formed on the upper surface of the substrate, and at least one of the holes penetrates the lid. Herein, the hole penetrating the lid is a venting hole, and the sealing screws can be the heat sink-attaching screws.

Further, a rubber packing is formed on the sealing screw on the upper surface of the lid.

The method for manufacturing semiconductor chip packages of the present invention comprises (a) preparing a substrate, the substrate having upper and lower surfaces, and a plurality of external connection pins extending from the lower surface; (b) attaching a chip to the upper surface of the substrate; (c) attaching a lid to the upper surface of the substrate, the lid comprising a cavity for receiving the chip on a lower surface and venting holes; and (d) hermetically sealing the venting holes with sealing screws.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 4:
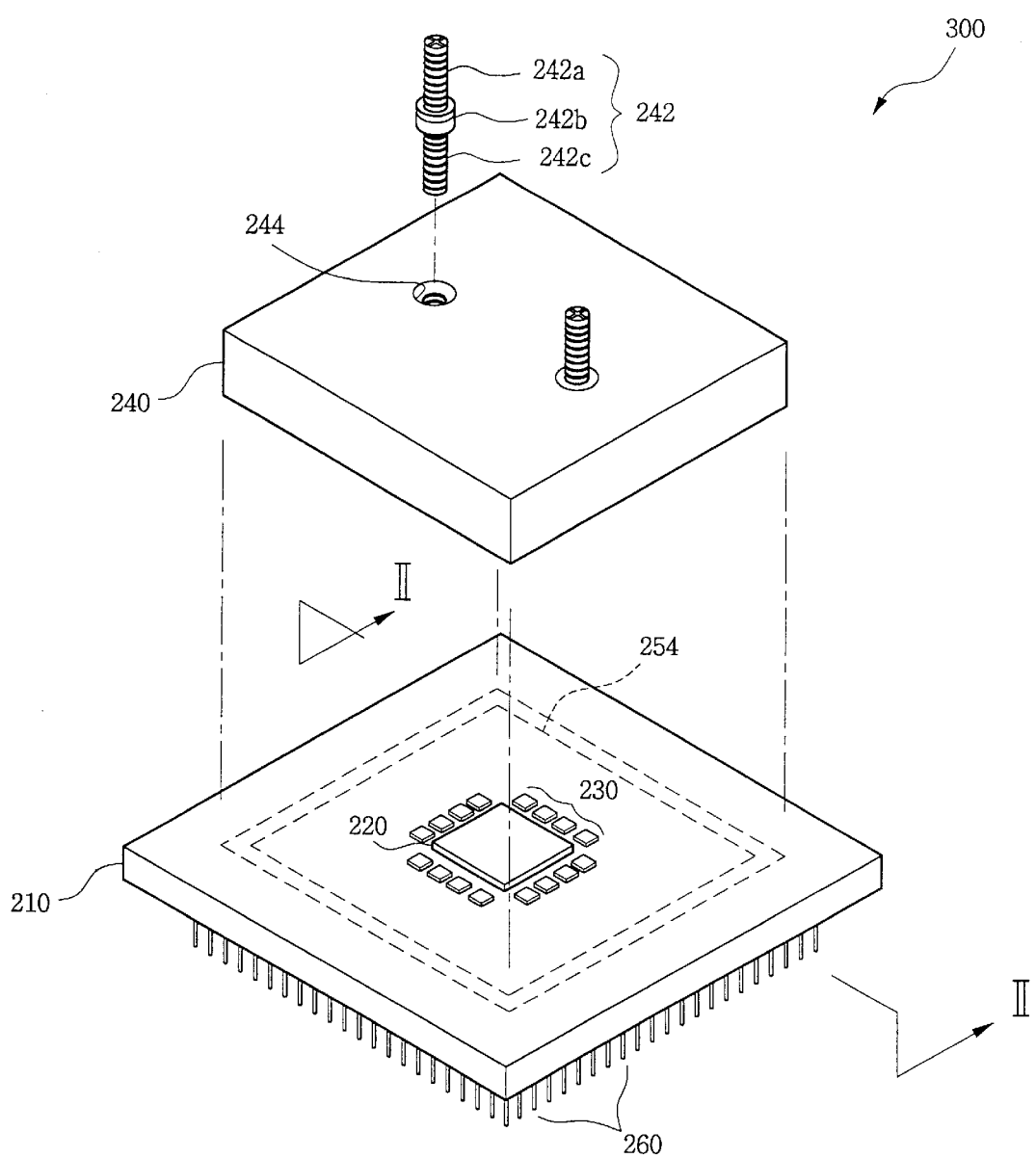
FIG. 4 is an exploded perspective view of a semiconductor chip package having a lid with venting holes, which are hermetically sealed with a screw, in accordance with an embodiment of the present invention.
Figure 5:
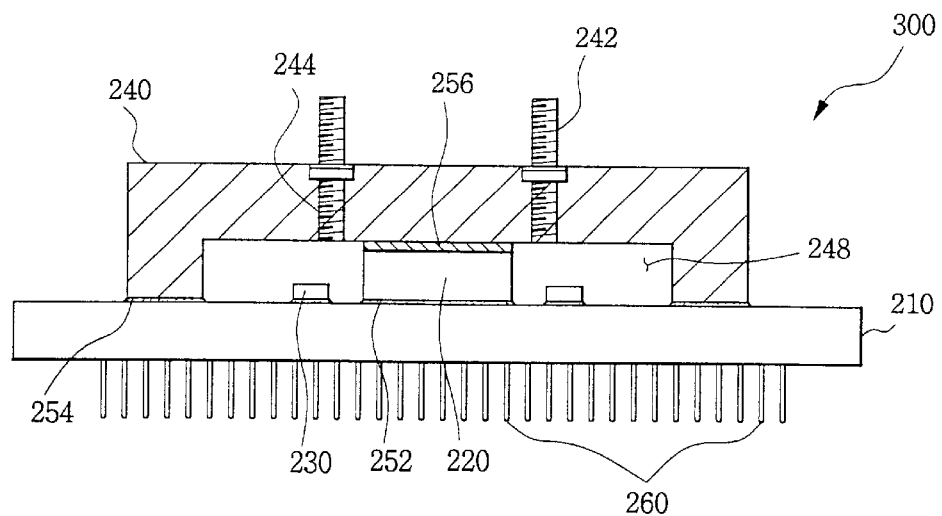
FIG. 5 is a cross-sectional view taken along the line II—II in FIG. 4.

FIG. 4 is an exploded perspective view of a semiconductor chip package 300 having a lid 240 with venting holes 244, and FIG. 5 is a cross-sectional view taken along the line II—II in FIG. 4.

As shown in FIG. 4 and FIG. 5, a CPU chip 220 and pluralities of capacitors 230 around the CPU chip 220 are attached to the upper surface of a ceramic substrate 210, preferably, using a flip-chip bonding method, and covered with a lid 240. However, a person skilled in the art would appreciate that other suitable electrical connection methods instead of the flip-chip bonding method might be used for the purpose of the present invention. Pluralities of external connection pins 260, which are electrically connected to the CPU chip 220, extend from a lower surface of the ceramic substrate 210. A flip-chip bonding part between the CPU chip 220 and the substrate 240 is filled with an epoxy resin 252 by an under-filling method. A screw 242 for combining with a heat sink is engaged with a corresponding one of the venting holes 244 of the lid 240.

The lid 240 is made of a metal having a good heat emissive (heat dissipation) capacity, i.e. having a high thermal conductivity, such as Al, W or Cu. The lid 240 comprises a cavity 248 for receiving the CPU chip 220 and the capacitors 230 on its lower surface.

In order to maximize the heat dissipation through the lid 240, a heat interface material 256 is interposed between the bottom of the cavity 248 and the upper surface of the CPU chip 220. As a sealant 254 for attaching the lid 240 to the upper surface of the ceramic substrate 210, a thermosetting silicon adhesive is preferably used. However, a person skilled in the art will appreciate that other suitable adhesives can be used.

As the sealant 254 is hardened, gas and expanded air are emitted through the venting holes 244 into the outside of the lid 240. After hardening the sealant 254, since the screw 242 is engaged with the venting hole 244, voids or cracks can be prevented differently from the prior art structure. A rubber packing 242b is formed on the space between the screw 242 and the venting hole 244, thereby more hermetically sealing the cavity 248. The screw 242 comprises an upper body 242a for combining with a heat sink (not shown), a lower body 242c that is engaged with the venting hole 244, and a rubber packing 242b formed between the upper body 242a and the lower body 242c.

In the conventional technique, the package (200 in FIG. 3) comprises the notches 144 and the venting hole 146, separately. However, in accordance with the first embodiment of the present invention, the package (300 in FIG. 4) comprises only the venting holes 244. The venting holes 244 serve to emit the air as well as to be engaged with the screw 242 for combining with the heat sink.

In order to engage the screw 242 with the venting hole 244, an internal thread is formed on the inside wall of the venting hole 144 and an external thread is formed on the lower body 242c of the screw 242. The screw 242 has a cross-slotted head and thereby, the screw 242 is engaged with the venting hole 244 by a screwdriver. Alternatively, the slot of the head of the screw 242 may be formed of any other type suitable for the purpose the present invention.

Figure 8:
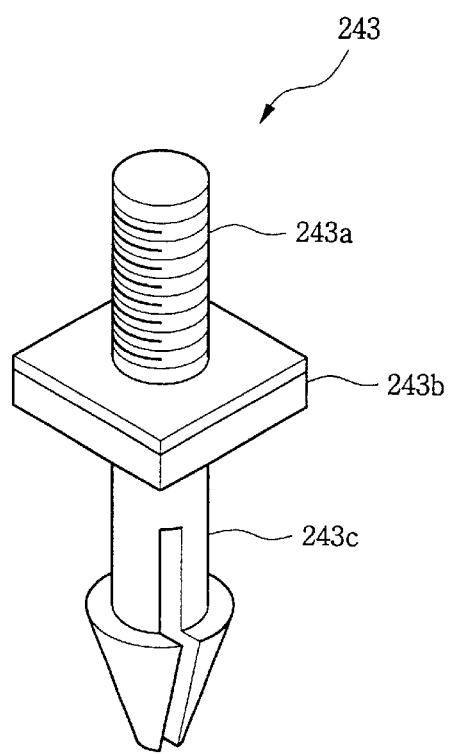
FIG. 8 is a perspective view of a heat sink-attaching screw of the present invention.

In the semiconductor chip package 300 of the first embodiment of the present invention, the screw 242 with an external thread is engaged with the venting hole 244 with an internal thread. However, if it is possible to hermetically seal the cavity between the upper surface of the substrate 210 and the lid 240, as shown in FIG. 8, a screw 243 having a lower body 243c with increased stability may be used. In this case, the screw 243 is close fit on the venting hole and therefore the formation of the internal thread on the inner wall of the venting hole is unnecessary. Reference numeral "243a" is an upper body of the screw 243 and reference numeral "243b" is a rubber packing.

Although the package 300 comprises two venting holes 244 perforating the lid 240, other variations and modifications in the number of the venting holes may be employed.

Figure 6:
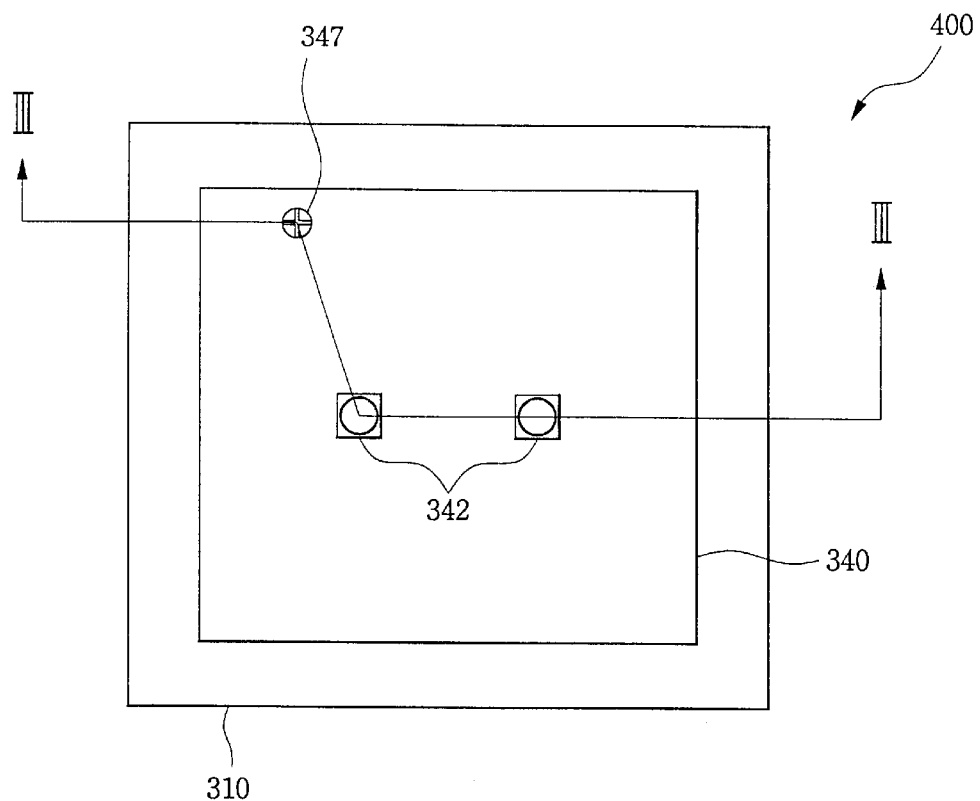
FIG. 6 is a plan view of a semiconductor chip package having a lid with both a venting hole and notches for the heat sink-attaching screws, in accordance with another embodiment of the present invention.
Figure 7:
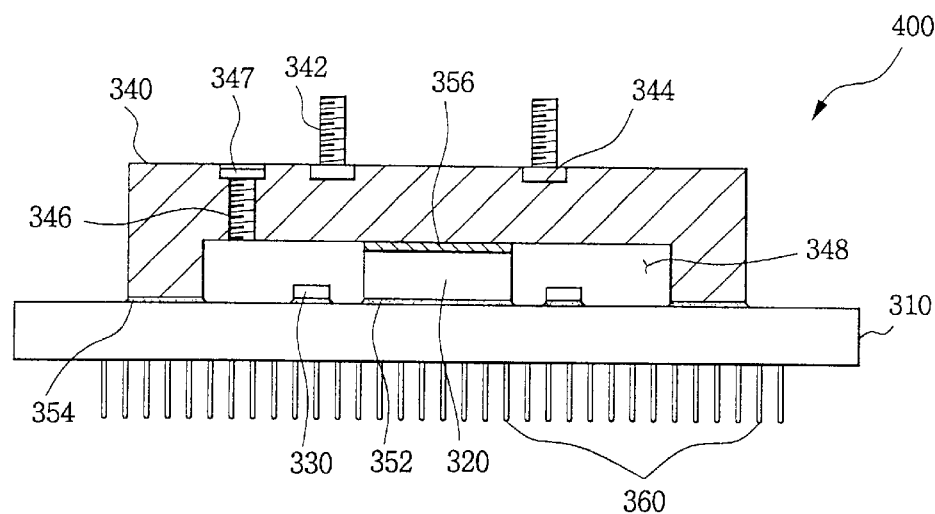
FIG. 7 is a cross-sectional view taken along the line III—III in FIG. 6.

FIG. 6 shows a semiconductor chip package 400 having a lid 340 with a venting hole 346 and notches 342 for heat sink-attaching screws 342, in accordance with a second embodiment of the present invention. FIG. 7 is a cross-sectional view taken along the line III—III in FIG. 6.

Figure 1:
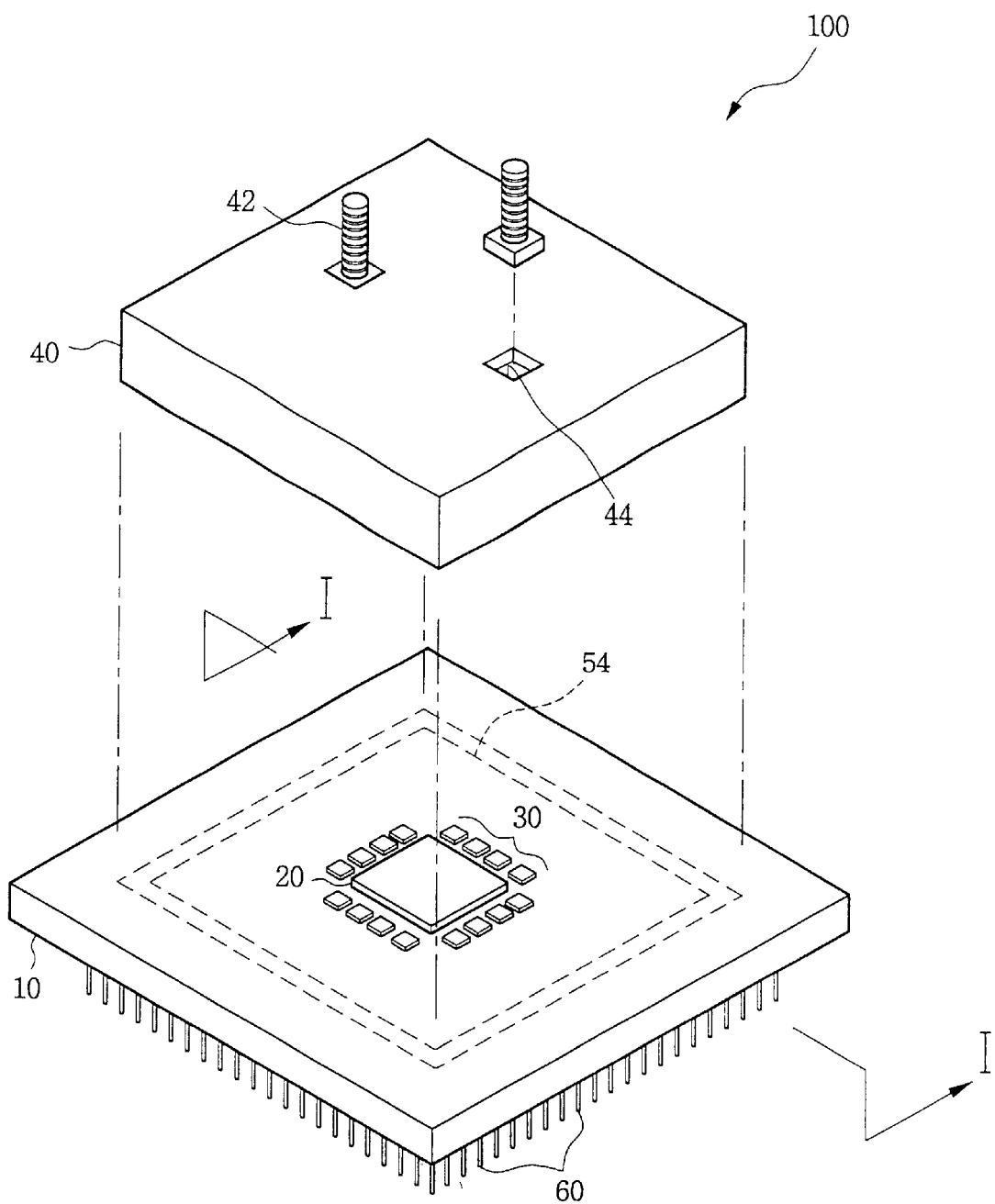
FIG. 1 is an exploded perspective view of a conventional semiconductor chip package.
Figure 2:
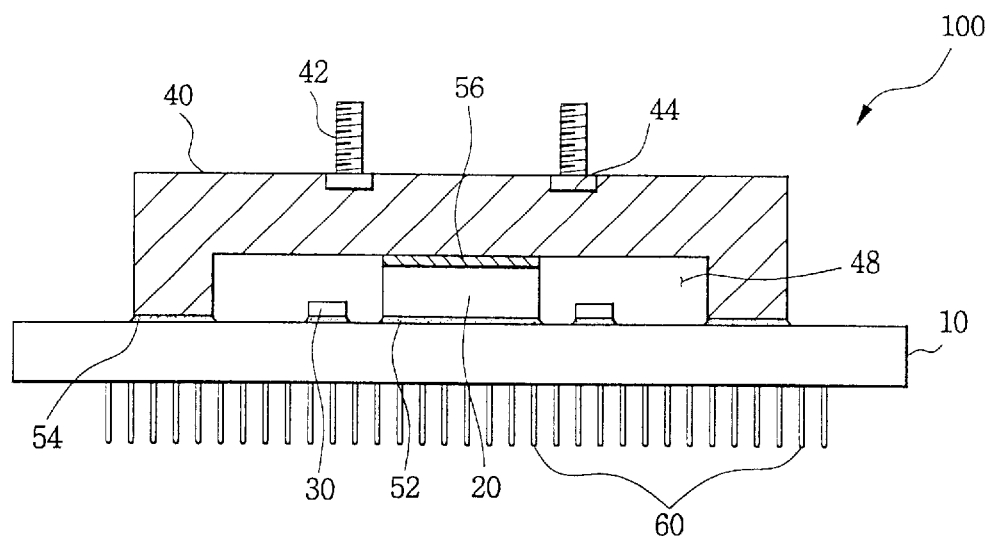
FIG. 2 is a cross-sectional view taken along the line I—I in FIG. 1.
Figure 3:
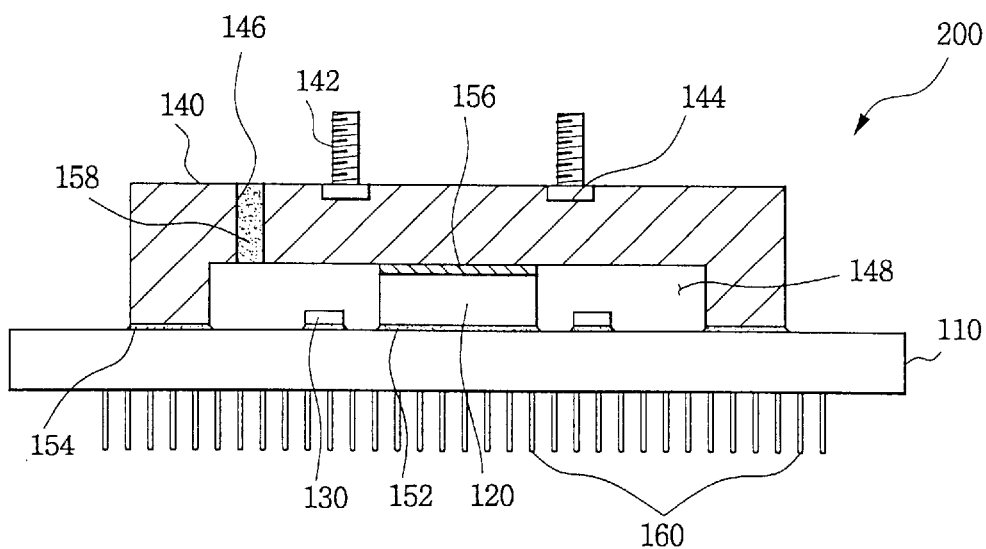
FIG. 3 is a cross-sectional view of another conventional semiconductor chip package having a lid with a venting hole, which is hermetically sealed with a sealant.

Referring to FIG. 6 and FIG. 7, the semiconductor chip package 400 has an arrangement similar to that of the semiconductor package 200 in FIG. 3 except that a venting hole 346 is hermetically sealed with a sealing screw 347.

After hardening the sealant 354, the venting hole 346 is hermetically sealed with sealing screw 347 and thereby voids in the sealant 354 are prevented. In order to engage the sealing screw 347 with the venting hole 346, the internal thread is formed on the inner wall of the venting hole 346. In order to more hermetically seal the cavity 348, a rubber packing (not shown) is attached to the screw 347 on the upper surface of the lid 340.

In the semiconductor chip package 400 of the second embodiment of the present invention, the screw 347 with the external thread is engaged with the internally threaded venting hole 346.

Figure 9:
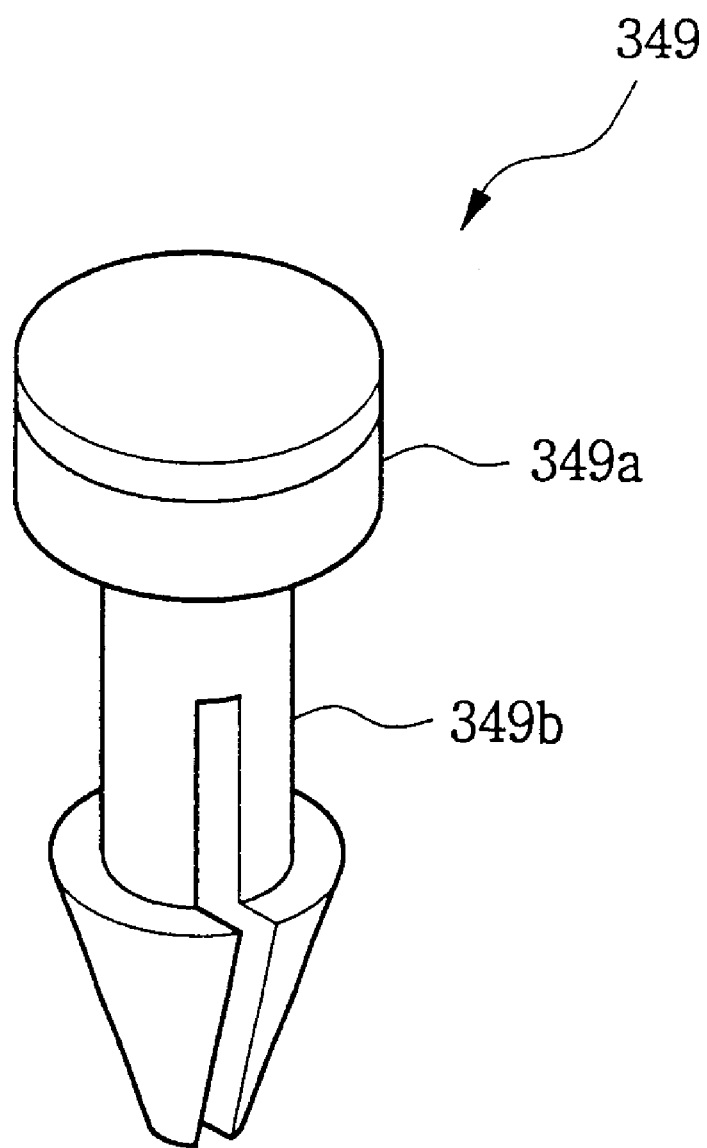
FIG. 9 is a perspective view of a sealing screw of the present invention.

However, if it is possible to hermetically seal the cavity between the upper surface of the substrate 310 and the lid 340, as shown in FIG. 9, a screw 349 having a lower body 349b with stability may be used. Herein, reference numeral "349a" is a rubber packing.

Figure 10:
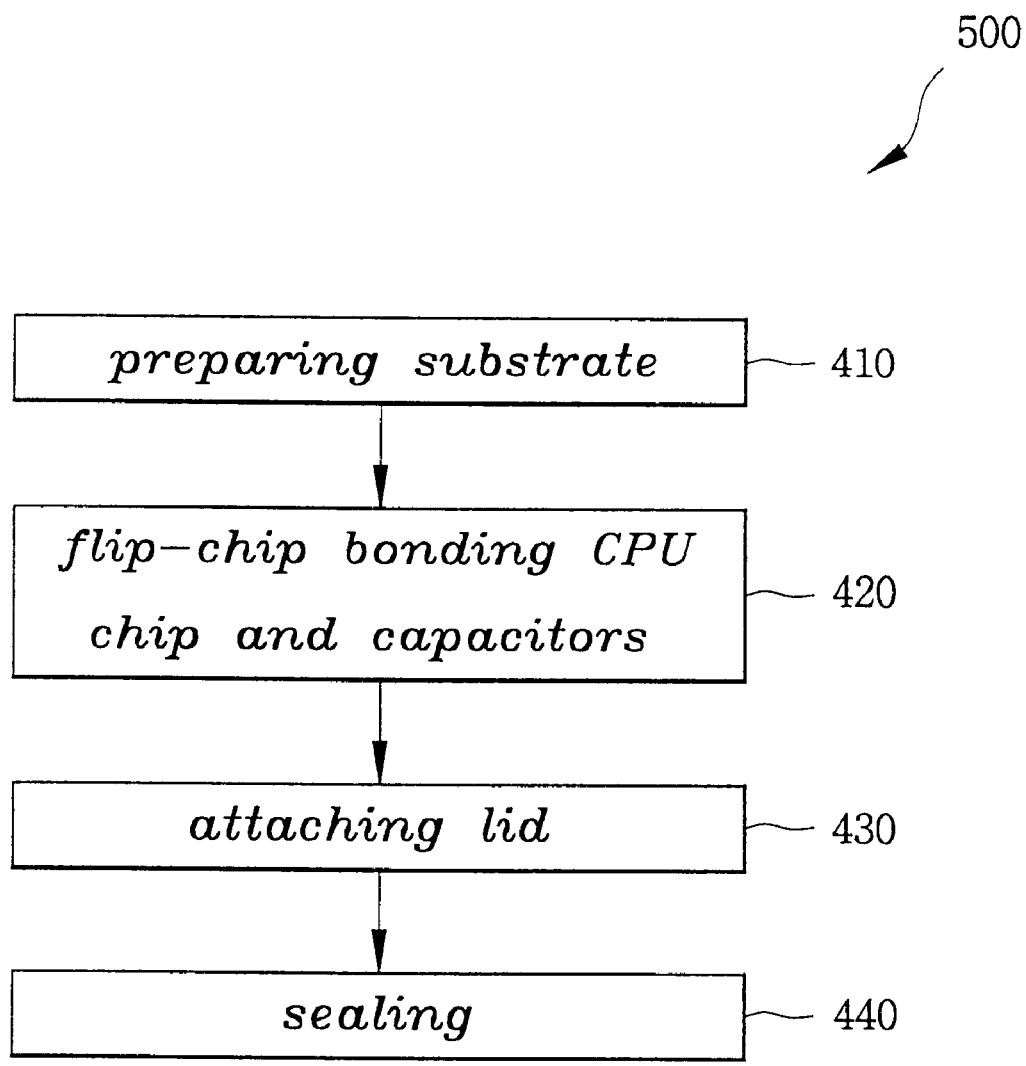
FIG. 10 is a flow chart illustrating a method for manufacturing semiconductor chip packages according to the present invention.

FIG. 10 is a flow chart illustrating a method for manufacturing the semiconductor chip packages of the present invention. Referring to FIG. 10, a manufacturing method 500 of the semiconductor chip packages is described below.

A ceramic substrate having an upper and a lower surface is prepared (step 410). Pluralities of external connection pins extend from the lower surface. Circuit wiring patterns (not shown) are formed on the upper and the lower surfaces.

A CPU chip is flip-chip bonded on the center of the upper surface of the substrate, and pluralities of capacitors are flip-chip bonded on the upper surface around the CPU chip (step 420). After the CPU chip having bumps is mounted on the upper surface of the substrate, and the reflowing process is carried out at 350~360° C. for 100 secs. Then, the space between the CPU chip and the substrate is filled with a liquid epoxy resin at 70~100° C. for approximately 180 secs. using an under-filling method.

A lid is attached to the upper surface of the substrate, thereby covering the CPU chip and the capacitors (step 430). A sealant is applied on the perimeter of the substrate. The lid is attached thereto and hardened at 150° C. for 1 hour. During the hardening process, the emitted gas and the expanded air are dispelled through the venting hole.

Prior to attaching the lid, a thermal interface material 356 is applied on the upper surface of the CPU chip. During attachment of the lid, the thermal interface material is attached to the lower surface of the lid within the lid cavity. Therefore, the heat generated from the CPU chip is transported via the thermal interface material to the lid and emitted to the outside.

The cavity between the substrate and the lid is hermetically sealed (step 440). That is, the screw engages with the venting hole. In the first embodiment of the present invention, the venting holes (244 in FIG. 5) serve to vent the air as well as to provide a connection to the heat sink. In the second embodiment of the present invention, the venting hole (346 in FIG. 7) serves to emit the air. The notches (344 in FIG. 7) for providing a connection to the heat sink are separately formed.

Accordingly, since the present invention comprises a lid having venting holes, the emitted gas and the expanded air are easily emitted to the outside through the venting holes. Further, the venting holes are hermetically sealed with screws. Therefore, during hardening of the sealant, voids or cracks in the sealant are prevented.

Although the preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A semiconductor chip package comprising:
    a substrate having upper and lower surfaces,
    a chip attached to the upper surface of said substrate;
    external connection terminals extending from the lower surface of said substrate and electrically connected to the chip;
    a lid attached to the upper surface of said substrate, said lid including a cavity for receiving the chip on the lower surface, said lid including venting holes formed therethrough; and
    one or more sealing screws for hermetically sealing said venting holes, the screw being fixed within the holes.

2. The semiconductor chip package of claim 1, further comprising one or more heat sink-attaching screws attached to an upper surface of said lid.

3. The semiconductor chip package of claim 2, wherein one or more recessed regions for attaching said heat sink-attaching screw are formed on the upper surface of said lid.

4. The semiconductor chip package of claim 3, wherein a rubber packing is formed on said sealing screw on the upper surface of said lid.

5. The semiconductor chip package of claim 2, wherein a rubber packing is formed on said sealing screw on the upper surface of said lid.

6. The semiconductor chip package of claim 1, further comprising one or more heat sink-attaching screws integrally formed with said one or more sealing screws.

7. The semiconductor chip package of claim 6, wherein a rubber packing is formed on said sealing screw on the upper surface of said lid.

8. The semiconductor chip package of claim 1, wherein a rubber packing is formed on said sealing screw on the upper surface of said lid.

9. The semiconductor package of claim 1, wherein said chip comprises a central process unit (CPU) chip.

10. A semiconductor chip package, comprising:
    a substrate having upper and lower surfaces,
    a chip flip-chip bonded to the upper surface of said substrate;
    a plurality of external connection terminals extending from the lower surface of said substrate and electrically connected to said chip;
    a lid attached to the upper surface of said substrate, said lid comprising a cavity for receiving said chip on a lower surface, the lid including one or more venting holes formed therethrough; and
    a sealing screw for hermetically sealing said venting holes, the screw being fixed within the holes.

11. The semiconductor chip package of claim 10, further comprising a plurality of capacitors bonded to the upper surface of said substrate around said chip.

12. The semiconductor chip package of claim 10, wherein the sealing screw is a heat sink-attaching screw, including:
    a lower body to engage said venting hole; and
    an upper body to provide a connection to a heat sink.

13. The semiconductor chip package of claim 12, wherein said heat sink-attaching screw comprises:
    a rubber packing to hermetically seal said lower body on said hole, the rubber packing attached between the upper body and the lower body.

14. A semiconductor chip package, comprising:
    a substrate having an upper and a lower surfaces,
    a chip flip-chip bonded to the upper surface of said substrate;
    a plurality of capacitors flip-chip bonded to the upper surface of said substrate around said chip;
    a plurality of external connection terminals extending from the lower surface of said substrate and electrically connected to said chip;
    a lid attached to the upper surface of said substrate, said lid comprising a cavity for receiving said chip and said capacitors on a lower surface, the lid including one or more venting holes penetrating therethrough and at least one notch;
    a sealing screw for hermetically sealing said venting holes, and
    heat sink-attaching screws for providing a connection to a heat sink, a head portion of said heat sink-attaching screw being disposed within said notch.

15. The semiconductor chip package of claim 14, wherein a rubber packing is formed on said sealing screw on the upper surface of said lid.

\* \* \* \* \*